(12) United States Patent
Wey et al.

(10) Patent No.: US 6,204,727 B1
(45) Date of Patent: Mar. 20, 2001

(54) PRECISION CONTROLLED RF POWER DETECTOR CIRCUIT

(75) Inventors: Chia-Sam Wey, Arlington; Kim Anh Tran, Garland; Jukka-Pekka Neitiniemi, Irving, all of TX (US)

(73) Assignee: Nokia Telecommunications OY, Espoo (FI)

(*) Notice: Subject to any disclaimer, the term of this patent is extended or adjusted under 35 U.S.C. 154(b) by 0 days.

(21) Appl. No.: 09/399,562

(22) Filed: Sep. 20, 1999

(51) Int. Cl.[7] .......................... H03K 19/22; H03K 21/10
(52) U.S. Cl. ........................... 329/370; 324/119; 327/61
(58) Field of Search .............................. 329/370; 324/119; 327/61

(56) References Cited

U.S. PATENT DOCUMENTS

| 4,236,126 | 11/1980 | Weller et al. | |
|---|---|---|---|
| 5,196,806 | * 3/1993 | Ichihara | 330/137 |
| 5,381,115 | * 1/1995 | Timmons et al. | 330/129 |
| 5,873,029 | * 2/1999 | Grondahl et al. | 455/126 |

* cited by examiner

*Primary Examiner*—Siegfried H. Grimm
(74) *Attorney, Agent, or Firm*—Brooke Hayes; Brian T. Rivers

(57) ABSTRACT

A controlled detector circuit for generating a detector current to the input of a selected circuit. An unwanted operational voltage is generated on the input of the selected circuit affecting the precision of the detector circuit. The controlled detector circuit comprises a detector circuit having an RF input for detecting a RF signal and a detector output for providing the detector current. Operation of the detector circuit generates a voltage drop affecting the precision of the detector current. A control circuit having a control output connected to the detector output generates a control voltage for reducing the unwanted parameters affecting the precision of the detector current.

17 Claims, 2 Drawing Sheets

PRECISION CONTROLLED RF POWER DETECTOR CIRCUIT

FIELD OF THE INVENTION

The present invention relates, in general, to RF power detectors and, in particular, to a method and apparatus for removing unwanted parameters affecting the precision and design characteristics of a detector circuit.

BACKGROUND OF THE INVENTION

Without limiting the scope of the invention, its background is described in connection with a detector circuit used in a RF power detector.

In a wireless communication system, for example, a Global System for Mobile (GSM) system using a Time Division Multiple Access (TDMA) signaling format that includes a framed structure comprising eight time slots, a mobile station communicates with a base station by transmitting and receiving information in one or more of the time slots that comprise a channel. Each channel is assigned to a different user, with mobile-to-base transmission (uplink) on one frequency band and base-to-mobile (downlink) on a second frequency band.

In order to preserve the integrity of the transmitted and received information and to reduce adjacent channel interference, the system operates according to a standardized format that defines the requirements of transmission and reception. A system transmitting and receiving information often produces unwanted interference. This unwanted interference affects the integrity of the transmitted and received information. For example, a power control loop uses negative feedback to adjust the operating point of a power amplifier so that the power amplifier operates in a specified range. However, unwanted interference parameters inherent in the operation of the power control loop may cause an inaccurate representation of the information to be controlled in the feedback loop resulting in inaccurate adjustment of the power amplifier's operating point.

The feedback control loop controls the operation of the power amplifier by using a RF power detector to sample the output signal and compare the output signal with a reference signal, where the reference signal is proportional to the required output. The RF power detector output is used as an error signal to adjust the power amplifier's operating point to correct any unwanted deviations detected at the output. Unwanted interference parameters of the RF power detector could affect the signals in the loop and may result in an incorrect adjustment of the power amplifier.

RF power detectors comprise a detector circuit and a linearizer. The detector circuit rectifies a detected portion of RF input power and the linearizer outputs a linear voltage. The relationship between detected voltage and RF input is linear for high power levels and square law for low power levels. The linear circuit is required to amplify the square law region and thus increases the power detectors dynamic range. The generation of unwanted parameters inherent in the operation of the detector circuit and linearizer affects the linear relationship between the RF power detector output and RF input at low power levels, thus reducing the detector's dynamic range.

Reference is now made to FIG. 1 where a prior art RF power detector is illustrated and denoted generally as 10. RF power detector 10 comprises a detector circuit 12 for receiving a RF input power $P_{in}$ and a linearizer 14 for supplying a linear voltage. Detector circuit 12 comprises a diode D for detecting a level, detected voltage $V_{det}$, of RF input power $P_{in}$. Diode D comprises an anode coupled to RF input power $P_{in}$ and a cathode coupled to linearizer 14 through a capacitor C and a resistor R. Diode D is biased by a bias current $I_b$ from a bias voltage source $-V_s$ coupled to diode D through a resistor $R_b$. Biasing diode D creates a voltage drop $V_D$ that is a function of varying operating temperatures of diode D.

Linearizer 14 may comprise a compensated logarithmic amplifier 16 such as the one described in co-pending U.S. patent application, filed Jul. 16, 1999, Ser. No. 09/354,984. Compensated logarithmic amplifier 16 comprises a logarithmic amplifier 18 and a compensation circuit 20 for removing unwanted parameters from a power detector output $V_{out}$. The operational effect of compensated logarithmic amplifier 16 is represented as a external voltage source $V_a$ independent of the operation of detector circuit 12. A detector voltage $V_c$ across capacitor C is coupled to linearizer 14 through resistor R producing a detector current $I_c$ supplied to linearizer 14. Ideally detector output voltage $V_c$ should equal detected voltage $V_{det}$, however, operational affects of diode D, voltage drop $V_D$, and external voltage source $V_a$ affect detector current $I_c$ causing a misrepresentation of RF input power $P_{in}$.

$$I_c = \frac{1}{R_1} \cdot (V_c - V_a) = \frac{1}{R_1} \cdot (V_{det} - V_D - V_a); \quad \text{Eq. 1}$$

When $P_{in} \neq 0$

When there is no RF input applied under normal DC bias saturation there should be no detector current $I_c$. However, with diode voltage $V_D$ and voltage source $V_a$ detector current $I_c$ does not equal zero as can be seen from equation 2.

$$I_c = \frac{1}{R_1} \cdot (-V_D - V_a); \quad \text{When } P_{in} = 0 \quad \text{Eq. 2}$$

Typically, voltage drop $V_D$ and external voltage source $V_a$ are compensated using bias point tuning in both detector circuit 12 and linearizer 14. However, bias point tuning hinders design flexibility since tuning of one circuit is dependent on operational affects of the other circuit. Therefore, detector circuit 12 and linearizer 14 when designed must consider biasing measures used in the other circuit.

As may be seen from Equation 1 and Equation 2, an improved apparatus to effectively remove unwanted parameters affecting the output of a detecting circuit could improve the precision and design characteristics of RF power detector.

SUMMARY OF THE INVENTION

The present invention presents an improved apparatus for reducing internally and externally induced parameters at the output of a detector circuit used in RF power detectors.

A controlled detector circuit is presented for generating a detector current to the input of a selected circuit. Operation of the selected circuit generates an unwanted operational voltage on the input of the selected circuit affecting the detector current. The controlled detector circuit comprises a detector circuit having an RF input for detecting an RF signal and a detector output for providing the detector current in response to the RF signal. The detector output is coupled to the input of the selected circuit. Operation of the detector circuit generates a voltage drop affecting the detector current. Voltage drop and unwanted operational voltage are unwanted parameters affecting the precision of the detector current.

The controlled detector circuit comprises a control circuit having a control output coupled to the detector output. The control circuit generates a control voltage on the control output. The control voltage compensates the effects of the voltage drop and the operational voltage on the detector current.

In an embodiment, the detector circuit comprises a diode having a cathode and a anode with the anode coupled to the RF input and the cathode coupled to the detector output through a low pass filter. A bias voltage source for negatively biasing the diode is coupled to the cathode of the first diode. Biasing the diode produces the voltage drop, referred to herein as the first voltage drop, affecting the detector current. In this embodiment, the control circuit comprises a diode having a cathode and a bias voltage source coupled to the cathode for negatively biasing the diode. Biasing the diode produces a second voltage drop substantially equivalent to the first voltage drop. The control circuit further comprises an operational amplifier having a non-inverting input coupled to the operational voltage and an inverting input coupled to the cathode of the second diode. The operational amplifier further has an output defined as the control output coupled to the inverting input. The operational amplifier produces a difference voltage according to the difference between the second voltage drop and the operational voltage.

In an alternative embodiment, the detector circuit comprises a low-pass filter and a diode having a cathode and an anode. The anode is coupled to the RF input and the cathode is coupled to the detector output through the low-pass filter. A bias voltage source for negatively biasing the diode is coupled to the cathode of the diode. The voltage drop, referred to herein as the first voltage drop, is produced across the first diode by the first bias voltage source. A boost output is coupled to the anode of the first diode. The boost output provides a first difference voltage according to the difference between a second voltage drop and the operational voltage. A first reduced voltage drop is applied across the low pass filter, where the first reduced voltage drop is the difference between the first difference voltage and the first voltage drop.

In this alternative embodiment, the control circuit comprises a diode having a cathode and an anode with the cathode coupled to a bypass capacitor and the anode coupled to the boost output. A second bias voltage source for negatively biasing the diode is coupled to the cathode of the second diode, wherein the second diode is negatively biased to produce a third voltage drop substantially equivalent to the first voltage drop. A second reduced voltage drop, substantially equivalent to the first reduced voltage drop, is applied across the bypass capacitor, wherein the second reduced voltage drop is the difference between the first difference voltage drop and the third voltage drop. The control circuit further comprises an operational amplifier having a non-inverting input, an inverting input and an output defined as the control output. The non-inverting input is coupled to the operational voltage. The inverting input is coupled to the control output and the diode is coupled to the inverting input through the bypass capacitor. The operational amplifier produces a second difference voltage according to the difference between the second reduced voltage drop and the operational voltage.

In the alternative embodiment, the boost output is further defined as having a boost circuit comprising a second operational amplifier having a non-inverting input, an inverting input and the boost output. The non-inverting input of the second operational amplifier is coupled to the operational voltage. A third diode having a cathode and a anode, with the cathode of the third diode coupled to the inverting input of the second operational amplifier and the anode of the third diode coupled to the boost output. A third bias voltage source for negatively biasing the third diode. The third bias voltage source coupled to the cathode of the third diode wherein the third diode is negatively biased to produce a second voltage drop substantially equivalent to the first voltage drop and third voltage drop.

BRIEF DESCRIPTION OF THE DRAWINGS

For a more complete understanding of the present invention, including its features and advantages, reference is made to the detailed description of the invention, taken in conjunction with the accompanying drawings of which.

DETAILED DESCRIPTION OF THE INVENTION

While the use and implementation of particular embodiments of the present invention are presented in detail below, it will be understood that the present invention provides many inventive concepts, which can be embodied in a wide variety of contexts. The specific embodiments discussed herein are merely illustrative of specific ways to make and use the invention and are not intended to limit the scope of the invention.

Figure 1:
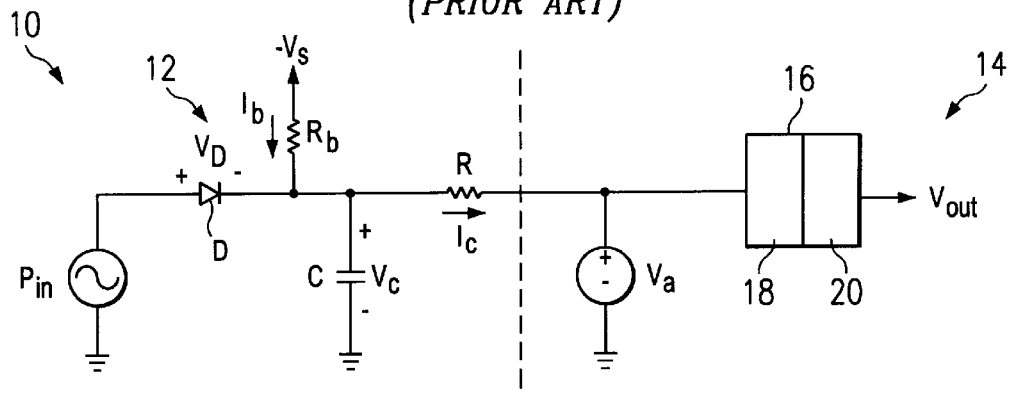
FIG. 1 is a block diagram of a prior art RF power detector.
Figure 2:
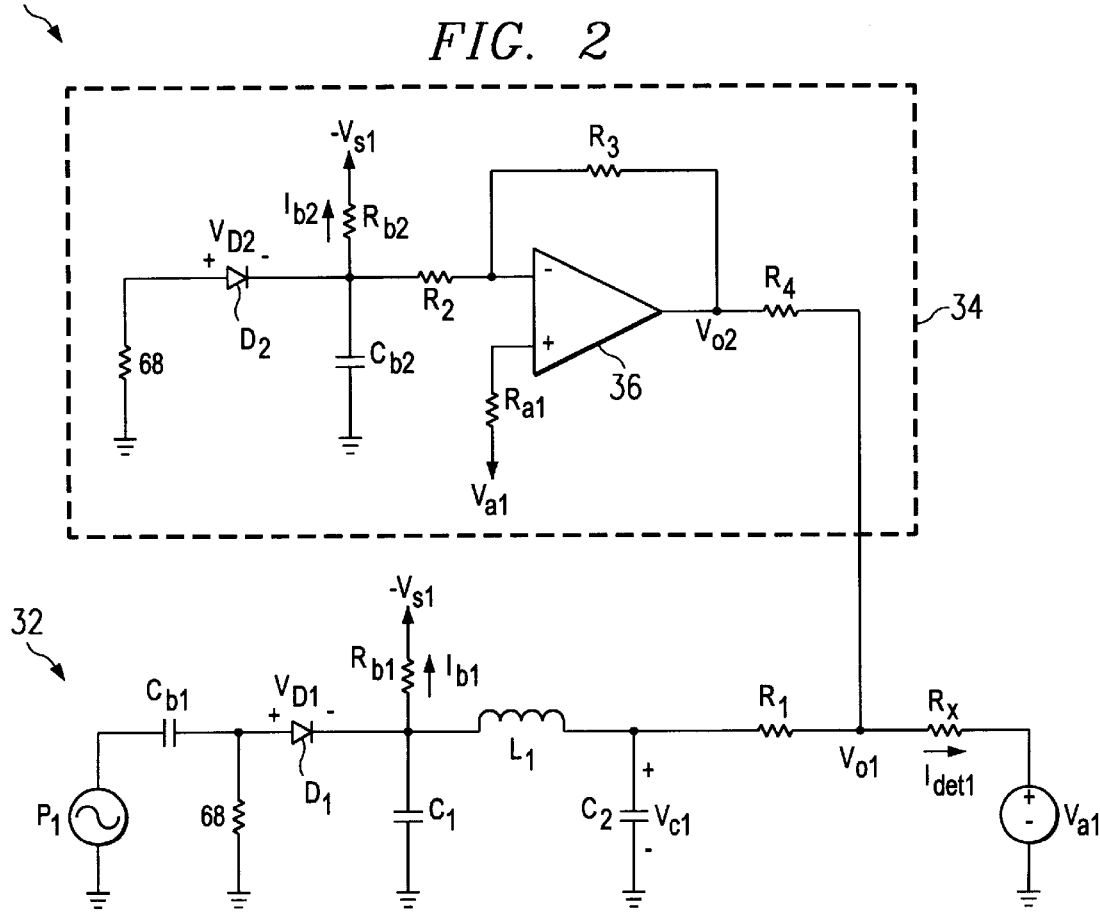
FIG. 2 is a detecting circuit according to an embodiment of the invention.

Referring now to FIG. 2, therein is illustrated a precision controlled detector circuit 30 according to an embodiment of the invention. Precision controlled detector circuit 30 comprises a detector circuit 32 having a RF input power $P_1$ and a detector output $V_{o1}$ and a control circuit 34 coupled to detector output $V_{o1}$ for reducing unwanted parameters from detector output $V_{o1}$. Detector output $V_{o1}$ is coupled to an external voltage source $V_{a1}$ through resistor $R_x$. External voltage source $V_{a1}$ may be induced from an external circuit such as linearizer 14 illustrated in FIG. 1. Detector circuit 32 detects RF input power $P_1$ and outputs a detector current $I_{det1}$ proportional and partly linear with respect to RF input power $P_1$ and independent from external voltage source $V_{a1}$.

Detector circuit 32 includes a diode $D_1$ for detecting the level, a detected voltage $V_{det1}$, of RF input power $P_1$ and a low pass filter comprising a capacitor $C_1$, a inductor $L_1$ and a capacitor $C_2$ for filtering unwanted frequencies. Diode $D_1$ is biased by a bias current $I_{b1}$ supplied by a bias voltage source $-V_{s1}$ coupled to diode $D_1$ through a resistor $R_{b1}$. Biasing diode $D_1$ creates a voltage drop $V_{D1}$ that is a function of varying operating temperatures of diode $D_1$. An output voltage $V_{c1}$ across capacitor $C_2$ is coupled to detector output $V_{o1}$ through a resistor $R_1$.

$$V_{c1}=V_{det1}-V_{D1} \qquad \text{Eq. 3}$$

Control circuit 34 comprises an operational amplifier 36 and a diode $D_2$ for approximately replicating affects similar to diode $D_1$. Diode $D_1$ and diode $D_2$ are of the same type and are placed in thermal contact so each produce similar results. Diode $D_1$ and $D_2$ maybe placed in close thermal contact by either positioning diode $D_1$ and $D_2$ in close proximity on a heat sink or packaging the two devices together in the same monolithic package. In order to prevent RF interference and to provide adequate RF isolation for diodes $D_1$ and $D_2$, a bypass capacitor $C_{b2}$ is placed in close proximity.

Bias voltage source $-V_{s1}$ is coupled to the cathode of diode $D_2$ through a resistor $R_{b2}$ providing a bias current $I_{b2}$ where bias current $I_{b2}$ equals bias current $I_{b1}$. Biasing diode $D_2$ produces a voltage drop $V_{D2}$ across diode $D_2$ approximately equal to voltage drop $V_{D1}$ across diode $D_1$. Diode $D_2$ and $D_1$ are identical components similarly biased and in close thermal contact and should approximately generate similar results. Operational amplifier 36 comprises a non-inverting input coupled to induced voltage source $V_{a1}$ through resistor $R_{a1}$ and a inverting input coupled to the cathode of diode $D_2$ through a resistor $R_2$. The anode of diode $D_2$ is coupled to ground through a resistor of 68 ohms to replicate the bias circuit of diode $D_1$. A control output $V_{o2}$ of operational amplifier 36 is coupled to the inverting input through a resistor $R_3$ and to detector output $V_{o1}$ through a resistor $R_4$. Control output $V_{o2}$ of operational amplifier 36 contains the difference of induced voltage source $V_{a1}$ and voltage drop $V_{D2}$ as can be seen in equation 4.

$$V_{o2} = \left(\frac{R_3 + R_2}{R_2}\right) \cdot V_{a1} + \frac{R_3}{R_2} \cdot V_{D2} \qquad \text{Eq. 4}$$

$$= V_{a1} + \left(\frac{V_{a1} + V_{D2}}{R_2}\right) \cdot R_3$$

$$= 2V_{a1} + V_{D2}; \quad \text{where } R_1 = R_2 = R_3$$

Ideally, detector current $I_{det1}$ should be an accurate representation of RF input power $P_1$. However, voltage drop $V_{D1}$ across diode $D_2$ affects the relationship between detector voltage $V_{det1}$ and RF input power $P_1$. Applying control output $V_{o2}$ to detector output $V_{o1}$ reduces voltage drop $V_{D1}$ from detector output $V_{o1}$ as can be seen in equation 5.

$$V_{o1} = \frac{V_{o2} \cdot R_1 + V_{c1} \cdot R_4}{R_1 + R_4} = \frac{1}{2} \cdot (V_{o2} + V_{c1}); \quad \text{where } R_1 = R_4 \qquad \text{Eq. 5}$$

$$= V_{a1} + \frac{1}{2} \cdot (V_{det1} + (V_{D2} - V_{D1})); \quad \text{when } P_1 \neq 0$$

$$= V_{a1} + \frac{1}{2} \cdot (V_{D2} - V_{D1}); \quad \text{when } P_1 = 0$$

As can be seen in equation 6 induced voltage source $V_{a1}$ is compensated at detector output $V_{o1}$ and therefore does not affect the precision of detector current $I_{det1}$ and allows independent design of a cascaded linearizer or similar circuitry.

$$I_{det1} = \left(\frac{V_{o1} - V_{a1}}{R_x}\right) \qquad \text{Eq. 6}$$

$$= \frac{1}{2} \cdot \frac{V_{det1} + (V_{D2} - V_{D1})}{R_x}$$

$$\cong \frac{1}{2} \cdot \frac{V_{det1}}{R_x}; \quad \text{when } P_1 \neq 0$$

$$I_{det1} = \left(\frac{V_{o1} - V_{a1}}{R_x}\right)$$

$$= \frac{V_{a1} + \frac{1}{2}(V_{D2} - V_{D1}) - V_{a1}}{R_x}$$

$$\cong 0; \quad \text{When } P_1 = 0$$

Detector circuit 30 reduces voltage drop $V_{D1}$ and compensates for external voltage source $V_{a1}$ thus providing flexibility for the design of the linearizer circuit. Typically, cascaded circuits are dependent on design parameters of the detector circuit. However, the above circuit eliminates unwanted parameters affecting the output and allows flexibility in the design of cascaded circuits. As can be seen from equation 6, control circuit 34 allows detector circuit 32 to be completely independent from external influences and does not allow internally induced voltages to significantly affect the output.

Figure 3:
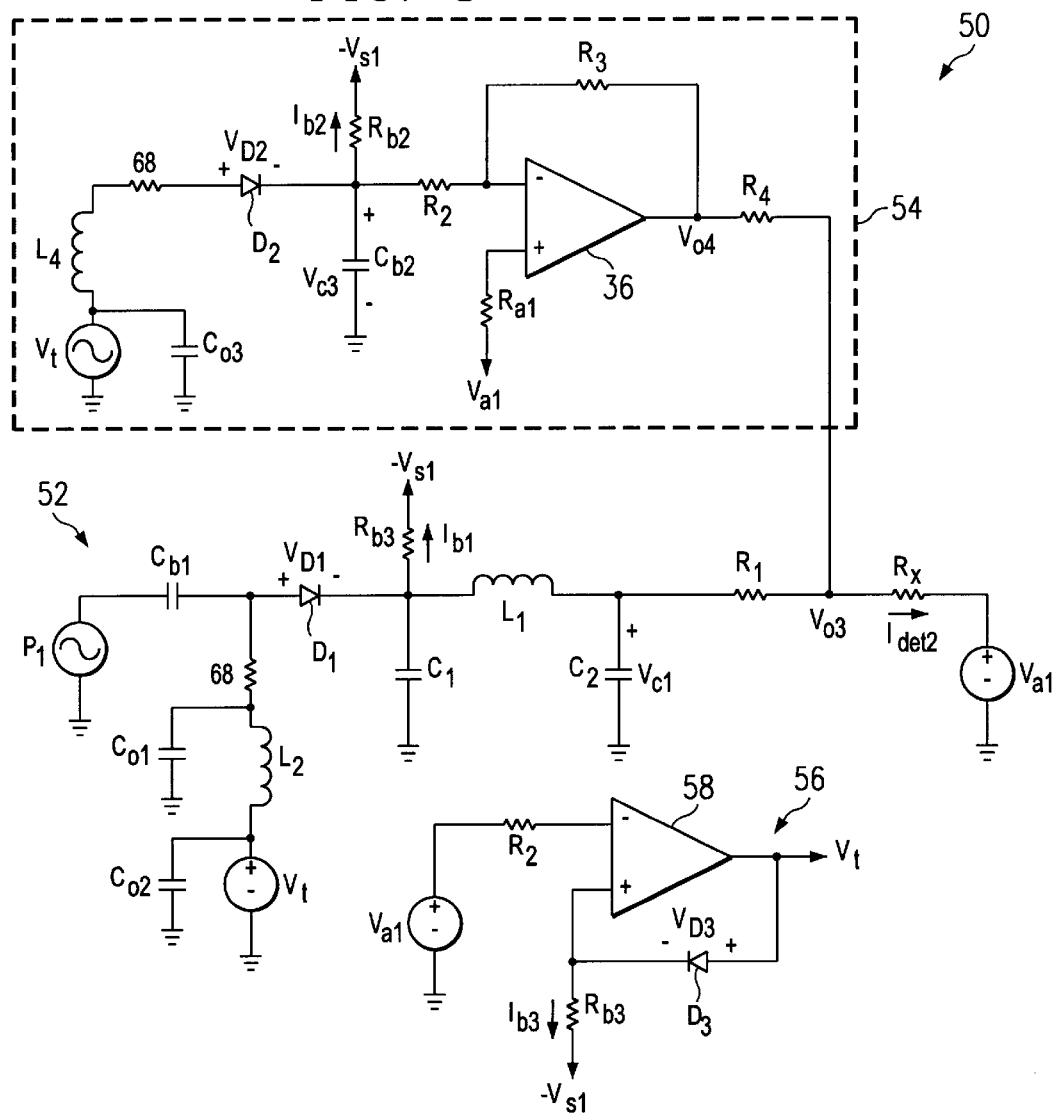
FIG. 3 is a detecting circuit according to an alternative embodiment of the invention.

Turning now to FIG. 3, where an alternate embodiment of the precision controlled detector circuit is illustrated and denoted generally as 50.

Precision controlled detector circuit 50 comprises a detector circuit 52 having RF input power $P_1$ and a detector output $V_{o3}$, a control circuit 54 coupled to detector output $V_{o3}$, and a boosting circuit 56 having a boost output $V_1$ coupled to detector circuit 52 and control circuit 54. Detector output $V_{o3}$ is coupled to external voltage source $V_{a1}$ through resistor $R_x$. External voltage source $V_{a1}$ may be induced from an external circuit such as linear circuit 14 illustrated in FIG. 1. Detector circuit 52 detects RF input power $P_1$ and outputs a detector current $I_{det2}$ independent of external voltage source $V_{a1}$.

Detector circuit 52 includes diode $D_1$ for detecting a level, detected voltage $V_{det1}$, of RF input power $P_1$ and a low pass filter comprising capacitor $C_1$, inductor $L_1$ and capacitor $C_2$ for filtering unwanted frequencies. Diode $D_1$ is biased by bias current $I_{b1}$ supplied by bias voltage source -Vs, coupled to diode $D_1$ through resistor $R_{b1}$. Biasing diode $D_1$ generates voltage drop $V_{D1}$ that is a function of varying operating temperatures of diode $D_1$. Voltage drop $V_{D1}$ affects the quality of detected current $I_{det2}$ resulting in an inaccurate representation of RF input power $P_1$.

Boost circuit 56 comprises a operational amplifier 58 having a non-inverting input coupled to external voltage source $V_{a1}$ through a resistor $R_{a2}$ and a inverting input coupled to boost output $V_t$ through a diode $D_3$. Diode $D_3$ is of the same type as diodes $D_1$ and $D_2$ and are placed in close thermal contact. Diode $D_3$ is biased similarly to diode $D_1$ and $D_2$ by bias voltage source $-V_{s1}$ through resistor $R_{b3}$. Diode $D_3$ is biased by a bias current $I_{b3}$ equal to bias current $I_{b1}$ and $I_{b2}$. Biasing diode $D_3$ creates a voltage drop $V_{D3}$ across diode $D_3$ approximately equal to voltage drop $V_{D1}$ and $V_{D2}$. Boost output $V_t$ contains the difference between external voltage source $V_{a1}$ and voltage drop $V_{D3}$ as can be seen in equation 7.

$$V_t = V_{a1} + V_{D3} \qquad \text{Eq. 7}$$

Boost output $V_t$ is coupled to the anode of diode $D_1$ through a inductor $L_2$. Inductor $L_2$ prevents RF input power $P_1$ from leaking into boost output $V_t$. A capacitor $C_{o1}$ and a capacitor $C_{o2}$ provides returning ground for RF signal. Coupling compensation output $V_t$ to the cathode of diode $D_1$ significantly reduces the contribution of voltage drop $V_{D1}$ affecting detected voltage $V_{det1}$ as can be seen in equation 8.

$$V_{c2} = V_{det1} V_{D1} + V_t V_{det1} + V_{a1} + (V_{D3} - V_{D1}); \text{ when } P_1 \neq 0$$

$$V_{c2} = -V_{D1} + V_t = V_{a1} + (V_{D3} - V_{D1}); \text{ when } P_1 = 0 \qquad \text{Eq. 8}$$

Control circuit 54 comprises operational amplifier 36 and diode $D_2$ for approximately replicating affects similar to diode $D_1$. Diode $D_2$ and diode $D_1$ are of the same type and are placed in thermal contact so each produces similar results. Diode $D_1$ and $D_2$ maybe placed in close thermal contact by either positioning diode Di and $D_2$ in close proximity on a heat sink or packaging the two devices together in the same monolithic package. In order to prevent RF interference and to provide adequate RF isolation for diodes Di and $D_2$ bypass capacitor $C_{b2}$ is placed in close proximity.

Bias voltage source $-V_{s1}$ is coupled to the cathode of diode $D_2$ through resistor $R_{b2}$ providing bias current $I_{b2}$ equal to bias current $I_{b1}$. Biasing diode $D_2$ produces voltage drop $V_{D2}$ across diode $D_2$. Diode $D_2$ of similar characteristics as diode $D_1$ is similarly biased and produces voltage drop $V_{D2}$ approximately equal to voltage drop $V_{D1}$ across diode $D_1$. Boost output $V_t$ is coupled to the anode of diode $D_2$. Boost output $V_t$ significantly reduces the contribution of voltage drop $V_{D2}$ across operational amplifier input voltage $V_{C3}$ as can be seen from equation 9.

$$V_{c3} = V_t - V_{D2} = V_{a1} + V_{D3} - V_{D2} \quad \text{Eq. 9}$$

Operational amplifier 36 comprises a non-inverting input coupled to external voltage source $V_{a1}$ through resistor $R_{a1}$ and inverting input coupled to boost output $V_t$ through diode $D_2$, resistor of 68 ohms, and inductor $L_4$. Inductor $L_4$ blocks RF signals from leaking into boost output $V_t$ and a capacitor $C_{o3}$ provides returning ground for RF signals. A control output $V_{o4}$ of operational amplifier 36 is coupled to the inverting input through resistor $R_3$ and to detector output $V_{o3}$ through resistor $R_4$. Control output $V_{o4}$ of operational amplifier 36 contains the difference of induced voltage source $V_{a1}$ and operational amplifier input voltage $V_{c3}$ across $C_{b2}$ as can be seen in equation 10.

$$V_{o4} = \left(\frac{R_3 + R_2}{R_2}\right) \cdot V_{a1} - \left(\frac{R_3}{R_2}\right) \cdot V_{c3} \quad \text{Eq. 10}$$

Applying control output $V_{o4}$ to detector output $V_{o3}$ further reduces unwanted parameters as can be seen from equation 11.

$$V_{o3} = \left(\frac{V_{o4} - V_{c2}}{R_1 + R_4}\right) \cdot R_1 + V_{c2} \quad \text{Eq. 11}$$

$$= \frac{R_1 \cdot V_{o4} + R_4 \cdot V_{c2}}{R_1 + R_4}$$

$$V_{o3} = \frac{1}{R_1 + R_4} \cdot \left\{ R_1 \left[\frac{R_3 + R_2}{R_2} \cdot V_{a1} - \frac{R_3}{R_2} \cdot V_{c3}\right] + R_4 \cdot (V_{det1} + V_{a1} + V_{D3} - V_{D1}) \right\}$$

$$= \frac{1}{R_1 + R_4} \cdot \left\{ R_1 \left[\frac{R_3 + R_2}{R_2} \cdot V_{a1} - \frac{R_3}{R_2} \cdot (V_{a1} + V_{D3} - V_{D2})\right] + R_4 \cdot (V_{det1} + V_{a1} + V_{D3} - V_{D1}) \right\}$$

$$\cong V_{a1} + \frac{1}{2} \cdot V_{det1}; \quad \text{when } P_1 \neq 0$$

$$V_{o3} = \frac{1}{R_1 + R_4} \cdot \left\{ R_1 \left[\frac{R_3 + R_2}{R_2} \cdot V_{a1} - \frac{R_3}{R_2} \cdot V_{c3}\right] + R_4 \cdot (V_t - V_{D1}) \right\}$$

$$= \frac{1}{R_1 + R_4} \cdot \left\{ R_1 \left[\frac{R_3 + R_2}{R_2} \cdot V_{a1} - \frac{R_3}{R_2} \cdot (V_t - V_{D2})\right] + R_4 \cdot (V_t - V_{D1}) \right\}$$

$$= \frac{1}{R_1 + R_4} \cdot \left\{ (R_1 + R_4) \cdot V_{a1} + R_4 \cdot (V_{D3} - V_{D1}) + R_1 \cdot \frac{R_3}{R_2} \cdot (V_{D2} - V_{D3}) \right\}$$

$$= V_{a1} + \frac{R_4}{R_1 + R_4} \left[ (V_{D3} - V_{D1}) - \frac{R_1 \cdot R_3}{R_2 \cdot (R_1 + R_4)} (V_{D2} - V_{D3}) \right]; \quad \text{when } P_1 = 0$$

As can be seen in equation 12 induced voltage source $V_a$ is compensated at detector output $V_{o3}$ and therefore does not affect the precision of detector current $I_{det2}$ and allows independent design of a cascaded linearizer or similar circuitry.

$$I_{det2} = \left(\frac{V_{o3} - V_{a1}}{R_x}\right) \cong \frac{1}{2} \cdot \frac{V_{det1}}{R_x}; \quad \text{Eq. 12}$$

When $P_1 \neq 0$ and $R_1 = R_2 = R_3 = R_4$ $$I_{det2} = \frac{V_{o3} - V_{a1}}{R_x}$$

$$= \frac{R_4}{R_x \cdot (R_1 + R_4)} \cdot (V_{D3} - V_{D1}) - \frac{R_1 \cdot R_3}{R_x \cdot R_2 \cdot (R_1 + R_4)} (V_{D3} - V_{D2})$$

$$\cong 0;$$

When $P_1 = 0$ and if either $R_1 = R_2 = R_3 = R_4$ or $V_{D1} = V_{D2} = V_{D3}$ Results for detector circuit 50 indicate that the amount of negligible offset current is not dependent on resistor tolerances. For example, less than 0.5 $\mu$A in offset current affect detector current $I_{det2}$ when 1% resistors are used. If 0.1% resistors are used, the offset current affecting detector current $I_{det2}$ can be kept below 0.1 $\mu$A. Either case is an acceptable amount at the detector output. Detector circuit 30 required low tolerance resistors $R_1$, $R_2$, $R_3$ and $R_4$ in order to achieve a negligible offset current. Detector circuit 50 is not limited by resistor tolerance since the voltage drop affecting the detector output is compensated twice. The amount of offset present is negligible regardless of the resistive tolerances. Detector circuit 30 and 50 both reduce unwanted parameters affecting the detector current and allow design flexibility in cascaded circuitry. However, detector circuit 50 further improves precision over detector circuit 30.

Figure 4:
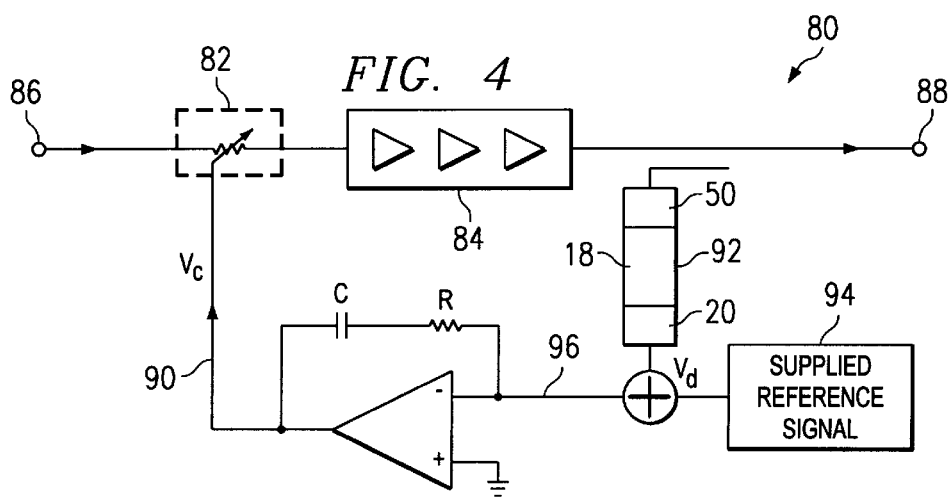
FIG. 4 is a preferred embodiment of the inventions of FIGS. 2 and 3.

Referring to FIG. 4, therein is illustrated an example of an application in which the embodiment of FIG. 2 or FIG. 3 may be utilized, a power control loop denoted generally as 80. A variable attenuator 82 is coupled to the input of an amplifier chain 84, and variable attenuator 82 and amplifier chain 84 are disposed between input 86 and output 88. A control signal $V_c$ on line 90 is applied to variable attenuator 82 to control the attenuation characteristics of variable attenuator 82. A power detector 92 comprising precision controlled detector circuit 30 or 50 and a precision controlled logarithmic amplifier circuit comprising logarithmic amplifier 18 and compensation circuit 20 are coupled to the output of the amplifier chain 84. A portion of the output signal is detected by power detector 92 and converted to a linear signal $V_d$. Linear signal $V_d$ is compared against a supplied reference signal $V_r$ from reference signal source 94. Reference signal $V_r$ is proportional to the desired output. Reference signal $V_r$ is compared to linear signal $V_d$ and the difference, an error signal $V_e$ at line 96, is integrated by integrator 98 to provide control signal $V_c$ at line 90 to variable attenuator 82.

Detector circuits 50 are often used in power detectors 92 to convert a detected RF signal to a linear voltage. Parameters inherent in the power detector introduce unwanted parameters at the output of detector circuit 92 resulting in an inaccurate representation of the detected signal. An inaccurate linear output produces an inaccurate error signal $V_e$. An inaccurate error signal $V_e$, in turn, produces a control signal $V_c$ that may cause the power amplifier to deviate from its required operating point. Implementation of either precision controlled detecting circuit 30 or 50 in power detector 92 would eliminate unwanted parameters from the output and provide a more accurate representative $V_d$ of the detected signal, $V_c$.

While this invention has been described with reference to particular embodiments, this description is not intended to be limiting. Various modifications and combinations of the illustrative embodiments, as well as other embodiments of the invention, will be apparent to persons skilled in the art. It is, therefore, intended that the appended claims encompass any such modifications or embodiments.

What is claimed is:

1. A controlled detector circuit for generating a detector current to the input of a selected circuit, wherein an unwanted operational voltage is generated on the input of the selected circuit in operation of the selected circuit; said controlled detector circuit comprising:

a detector circuit having an RF input for detecting an RF signal and a detector output for providing the detector current in response to said RF signal, said detector output coupled to the input of the selected circuit, wherein operation of said detector circuit generates a voltage drop which affects said detector current, and, further, wherein the operational voltage on the input of the selected circuit affects said detector current; and a control circuit having a control output coupled to said detector output, said control circuit generating a control voltage on said control output, said control voltage for compensating the effects of said voltage drop and said operational voltage on the detector current.

2. The controlled detector circuit of claim 1, wherein said voltage drop comprises a first voltage drop and wherein said detector circuit comprises:

a low-pass filter;

a first diode having a cathode and an anode, said anode of said first diode coupled to said RF input, and said cathode of said first diode coupled to said detector output through said low-pass filter;

a first bias voltage source for negatively biasing said first diode, said bias voltage source coupled to said cathode of said first diode, wherein said first voltage drop is produced across said first diode by said bias voltage source;

and wherein said control circuit comprises:

a second diode having a cathode and a anode, wherein said is anode is connected to a first ground through a resistor;

a second bias voltage source for negatively biasing said second diode, said second bias voltage source coupled to said cathode of said second diode, wherein said second diode is negatively biased to produce a second voltage drop substantially equivalent to said first voltage drop; and an operational amplifier having a non-inverting input, an inverting input and an output defined as said control output, said non-inverting input coupled to said operational voltage, said inverting input coupled to said control output, said inverting input coupled to said cathode of said second diode, wherein said operational amplifier produces a difference voltage according to the difference of said second voltage drop and said operational voltage on said control output.

3. The controlled detector circuit of claim 2, wherein said control circuit further comprises a bypass capacitor having a first side and a second side, wherein said first side is coupled to said cathode and said second side is coupled to a second ground.

4. The controlled detector circuit of claim 1, wherein said voltage drop comprises a first voltage drop, and wherein said detector circuit comprises:

a low-pass filter;

a first diode having a cathode and an anode, said anode of said first diode coupled to said RF input, and said cathode of said first diode coupled to said detector output through said low-pass filter;

a first bias voltage source for negatively biasing said first diode, said bias voltage source coupled to said cathode of said first diode, wherein said first voltage drop is produced across said first diode by said first bias voltage source;

a boost output coupled to said anode of said first diode, said boost output providing a first difference voltage according to the difference between a second voltage drop and said operational voltage;

a first reduced voltage drop applied across said low pass filter, where said first reduced voltage drop is a result of the difference between said first difference voltage and said first voltage drop;

and wherein said control circuit comprises:

a second diode having a cathode and a anode with said anode coupled to said boost output;

a bypass capacitor having a first side and a second side, wherein said first side coupled to said cathode and said second side coupled to a ground;

a second bias voltage source for negatively biasing said second diode, said second bias voltage source coupled to said cathode of said second diode, wherein said second diode is negatively biased to produce a third voltage drop substantially equivalent to said first voltage drop;

a second reduced voltage drop applied across said bypass capacitor, wherein said second reduced voltage drop is the difference between said first difference voltage drop and said third voltage drop; and an operational amplifier having a non-inverting input, an inverting input and a output further defined as said control output, said non-inverting input coupled to said operational voltage, said inverting input coupled to said control output, said inverting input coupled to said bypass capacitor, wherein said operational amplifier produces a second difference voltage according to the difference between said second reduced voltage drop and said operational voltage.

5. The controlled detector circuit of claim 4, wherein said operational amplifier comprises a first operational amplifier and, wherein said boost output is further defined as having a boost circuit comprising:
   a second operational amplifier having a non-inverting input, an inverting input and said boost output, said non-inverting input of said second operational amplifier coupled to said operational voltage;
   a third diode having a cathode and an anode, said cathode of said third diode coupled to said inverting input of said second operational amplifier, and said anode of said third diode coupled to said boost output; and
   a third bias voltage source for negatively biasing said third diode, said third bias voltage source coupled to said cathode of said third diode, wherein said third diode is negatively biased to produce a second voltage drop substantially equivalent to said first voltage drop and third voltage drop.

6. The controlled detector circuit of claim 4, wherein said second reduced voltage drop is approximately equal to said first reduced voltage drop.

7. A precision controlled detector circuit for inputting a detector current to the input of a next stage circuit, wherein said next stage circuit generates a voltage on said input during operation referred to herein as operational voltage source, said precision controlled detector circuit comprising;
   a detector circuit having an RF input for detecting an RF signal and a detector output for providing the detector current to the next stage circuit in response to said RF signal, wherein an operational effect of said detector circuit produces a first voltage drop that affects said detector current, and wherein the operational voltage source affects said detector current; and
   a control circuit having a control output coupled to said detector output and containing a control voltage for compensating the effects of said first voltage drop and said operational voltage source on the detector current.

8. The precision controlled detector circuit as recited in claim 7, wherein said detector circuit further comprises;
   a first diode having a cathode and an anode with said anode coupled to said RF input and said cathode coupled to said detector output through a low pass filter; and
   a negative bias source for biasing said first diode coupled to said cathode, wherein biasing said first diode produces said first voltage drop.

9. The precision controlled detector circuit as recited in claim 7, wherein said control circuit further comprises:
   a second diode having a cathode coupled to a negative bias source, wherein said negative bias source applied across said second diode produces a second voltage drop approximately equal to said first voltage drop; and
   an operational amplifier having an non-inverting input, an inverting input, and an output defined as said control output, said non-inverting input coupled to said operational voltage source, said inverting input coupled to said cathode of said second diode, and said inverting input coupled to said control output, wherein said control output contains a signal indicating the difference between the operational voltage source and the second voltage drop.

10. The precision controlled detector circuit as recited in claim 9, wherein control circuit further comprises a bypass capacitor having a first side and a second side with said first side coupled to said cathode and said second side coupled to a ground.

11. The precision controlled detector circuit as recited in claim 7, wherein said detector circuit further comprises:
   a first diode having an anode and a cathode with said anode coupled to said RF input and said cathode coupled to said detector output through a low-pass filter; and
   a negative bias source for biasing said first diode coupled to said cathode, wherein biasing said first diode produces said first voltage drop across said first diode; and
   a boost output having a boost signal is coupled to said anode of said first diode, wherein said boost output comprises the difference of a second voltage drop and said operational voltage source.

12. The precision controlled detector circuit as recited in claim 7, wherein said boost output is further defined as having a boost circuit comprising:
   an operational amplifier having a non-inverting input, an inverting input, and an output defined as said boost output, wherein said non-inverting input is coupled to said operational voltage source, said inverting input is coupled to said boost output through a feedback path; and
   a second diode disposed within said feedback path having an anode coupled to said boost output and a cathode coupled to a negative bias source.

13. The precision controlled detector circuit as recited in claim 11, wherein said boost output coupled to said anode of said first diode further comprises:
   a resistor in series with said boost output coupled to said anode;
   an inductor in series with said boost output coupled to said resistor;
   a first capacitor coupled in parallel between said resistor and said inductor; and
   a second capacitor coupled in parallel between said inductor and said boost output.

14. The precision controlled detector circuit as recited in claim 7, wherein said control circuit further comprises:
   a second diode having a anode and a cathode;
   a first negative bias source coupled to said cathode, wherein biasing said second diode produces a third voltage drop;
   a bypass capacitor having a first side and a second side with said first side coupled to said cathode and said second side coupled to a ground;
   a boost output coupled to said anode, wherein applying said boost output across said second diode produces a second reduced voltage drop across said bypass capacitor; and
   an operational amplifier having a non-inverting input, an inverting input, and an output defined as said control output, wherein said non-inverting input is coupled to said operational voltage source and an inverting input coupled to said second reduced voltage drop, and a control output coupled to said inverting input through a resistor, wherein said control output contains a signal comprising the difference between said operational voltage source and said second reduced voltage drop.

15. The precision controlled detector circuit as recited in claim 14, wherein said second reduced voltage drop is substantially equal to said first voltage drop.

16. The precision controlled detector circuit as recited in claim 14, wherein said boost output is further defined as having a boost circuit comprising:
   an operational amplifier having a non-inverting input, an inverting input, and an output defined as said boost output, wherein said non-inverting input is coupled to said operational voltage source, said inverting input is coupled to said boost output through a feedback path; and a third diode disposed within said feedback path having an anode coupled to said boost output and a cathode coupled to a second negative bias source.

17. The precision controlled detector circuit as recited in claim 14, wherein said anode of said second diode coupled to said boost output further comprises:

a resistor in series with said boost output coupled to said anode;

an inductor in series with said boost output coupled to said resistor; and a capacitor coupled in parallel between said inductor and said boost output.

* * * * *